(12) United States Patent
Mann et al.

(10) Patent No.: US 12,027,911 B2
(45) Date of Patent: Jul. 2, 2024

(54) MODULAR SOLAR CELL AND SOLAR CELL ARRAY

(71) Applicant: The Aerospace Corporation, El Segundo, CA (US)

(72) Inventors: Colin J. Mann, Los Angeles, CA (US); Don Walker, Whittier, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 17 days.

(21) Appl. No.: 17/695,763

(22) Filed: Mar. 15, 2022

(65) Prior Publication Data
US 2023/0299610 A1    Sep. 21, 2023

(51) Int. Cl.
| | | |
|---|---|---|
| H02J 7/35 | (2006.01) | |
| B64G 1/10 | (2006.01) | |
| B64G 1/42 | (2006.01) | |
| B64G 1/44 | (2006.01) | |
| H01L 31/02 | (2006.01) | |
| H01L 31/0475 | (2014.01) | |
| H01M 10/42 | (2006.01) | |
| H01M 10/615 | (2014.01) | |
| B64G 1/22 | (2006.01) | |

(52) U.S. Cl.
CPC .................. *H02J 7/35* (2013.01); *B64G 1/10* (2013.01); *B64G 1/425* (2013.01); *B64G 1/428* (2013.01); *B64G 1/443* (2013.01); *H01L 31/02008* (2013.01); *H01L 31/0475* (2014.12); *H01M 10/425* (2013.01); *H01M 10/615* (2015.04); *B64G 1/223* (2023.08); *H01M 2010/4271* (2013.01); *H01M 2220/20* (2013.01)

(58) Field of Classification Search
CPC .......... B64G 1/44; B64G 1/443; B64G 1/446
See application file for complete search history.

(56) References Cited

U.S. PATENT DOCUMENTS

| | | |
|---|---|---|
| 2,989,575 A | 6/1961 | Wallace |
| 3,116,171 A | 12/1963 | Nielsen et al. |
| | (Continued) | |

FOREIGN PATENT DOCUMENTS

| | | |
|---|---|---|
| CN | 204156807 U | 2/2015 |
| EP | 3239057 A1 | 11/2017 |

OTHER PUBLICATIONS

"NOAA's GOES-R Satellite Solar Array Spreads Its Wing", Jun. 16, 2015, https://www.nesdis.noaa.gov/news/noaas-goes-r-satellite-solar-array-spreads-its-wing.

(Continued)

*Primary Examiner* — Daniel P Malley, Jr.
(74) *Attorney, Agent, or Firm* — LeonardPatel PC

(57) ABSTRACT

Embodiments of the present invention include modular solar power cells, arrays, and power management systems for use in satellite systems and constellations. In one embodiment, a solar cell module can include: a module substrate including a high-emissivity side and a mounting side; a power management circuit mounted to the mounting side of the module substrate; a battery arranged adjacent to the power management circuit; a solar cell substrate arranged adjacent the battery and including an embedded battery heater; and a solar cell mounted directly to the solar cell substrate and connected to the battery.

20 Claims, 4 Drawing Sheets

(56) References Cited

U.S. PATENT DOCUMENTS

| | | | |
|---|---|---|---|
| 5,344,496 | A | 9/1994 | Stern et al. |
| 5,942,046 | A * | 8/1999 | Kahlfuss ............. H01L 31/0512 |
| | | | 136/251 |
| 6,005,184 | A * | 12/1999 | Barnes ................... H02S 40/42 |
| | | | 136/246 |
| 6,439,511 | B1 | 8/2002 | Ingersoll, Jr. et al. |
| 6,923,249 | B1 * | 8/2005 | Porter ............... H01M 10/6554 |
| | | | 136/246 |
| 8,809,102 | B2 | 8/2014 | Shimizu et al. |
| 9,608,156 | B2 | 3/2017 | Clevenger et al. |
| 10,536,107 | B1 * | 1/2020 | Ning ........................ B64G 1/44 |
| 2010/0116310 | A1 | 5/2010 | Shimizu et al. |
| 2017/0012160 | A1 | 1/2017 | Clevenger et al. |
| 2020/0185957 | A1 * | 6/2020 | Pearson ................... H02J 7/35 |
| 2022/0352405 | A1 * | 11/2022 | Derkacs ............... H01L 31/184 |

OTHER PUBLICATIONS

Gonzalez-Llorente, et al., "Solar Module Integrated Converters as Power Generator in Small Spacecrafts: Design and Verification Approach", Aerospace, 2019, 6, 61, www.mdpi.com/journal/aerospace.

Henry, Caleb, "LEO and MEO Broadband Constellations Mega Source of Consternation", SpaceNews, Mar. 13, 2018.

Messier, Doug, "mPower Technology's DragonSCALES Solar Cells to Launch on Sparkwing In-Orbit Demonstrator with Momentus' Vigoride Transfer Vehicle", www.parabolicarc.com, Oct. 19, 2020.

NASA, "3.0 Power", www.nasa.gov/smallsat-institute/sst-soa-2020/power.

NASA, "State-of-the-Art Small Spacecraft Technology", NASA/TP-2020-5008734, Small Spacecraft Systems Virtual Institute, Ames Research Center, Moffett Field, California, Oct. 2020.

* cited by examiner

MODULAR SOLAR CELL AND SOLAR CELL ARRAY

FIELD

The present invention relates to power management in space vehicles, and more particularly to modular solar cells and solar cell arrays deployable in a range of space vehicles.

BACKGROUND

Generally, satellite design and manufacture is a customized and long process that requires qualification and requalification of each and every component of the satellite system. Accordingly, for each system or subsystem within a satellite, any upgrade to more advanced technology can result in months to years of delays incurred by qualifying or requalifying the advanced technologies for space flight.

Concurrently there is an increased interest in using larger constellations of smaller satellites (e.g., cubesats or nanosats) to provide capabilities that were previously available only on legacy large satellite systems. However, qualifying or requalifying various components or subsystems for space flight for constellations of small satellites is resource intensive, consuming both time and budget, and eventually eliminating any economic and/or programmatic benefits gained from the use of smaller satellites.

For example, at the system level, custom solutions are designed, tested, and fabricated to meet specific mission requirements. However, the high level of customization at the system level also translates to custom tailored solutions for more generic subsystems, such as the power system, which in turn adds significant cost, time, and risk to the entire satellite acquisition and deployment process.

Accordingly, a new approach to designing and qualifying at least one system of a satellite may be beneficial.

SUMMARY

Certain embodiments of the present invention may provide solutions to the problems and needs in the art that have not yet been fully identified, appreciated, or solved by current satellite systems, and in particular space vehicle power systems. For example, some embodiments of the present invention can include a modular solar power system that can be readily designed, upgraded, expanded, and/or replaced without having to endure complete redesigns (and the concurrent requalification) of the satellite power system(s).

In one embodiment, a solar cell module can include: a module substrate including a high-emissivity side and a mounting side; a power management circuit mounted to the mounting side of the module substrate; a battery arranged adjacent to the power management circuit; a solar cell substrate arranged adjacent the battery and including an embedded battery heater; and a solar cell mounted directly to the solar cell substrate and connected to the battery.

In another embodiment, the module substrate can include or be composed of one or more of: aluminum, magnesium, vanadium, titanium, steel, carbon composite, and/or combinations, mixtures, or alloys thereof.

In another embodiment, the module substrate encloses the power management circuit, the battery, and the solar cell substrate.

In another embodiment, the battery includes a lithium ion solid state battery.

In another embodiment, the solar cell includes an inverted metamorphic solar cell.

In another embodiment, the power management circuit includes a power management circuit substrate including a polyamide film.

In another embodiment, the power management circuit includes a battery charge control module, a solar cell monitoring module, and a solar cell management module.

In yet another embodiment, the power management circuit further includes a communications module that communications module is configured to communicate with a space vehicle flight controller.

In still another embodiment, the high emissivity side of the module substrate is arranged adjacent a space vehicle chassis.

In another embodiment, a modular solar cell array can include a first solar cell module including: a first module substrate including a first high-emissivity side and a first mounting side; a first power management circuit mounted to the first mounting side of the first module substrate; a first battery arranged adjacent to the first power management circuit; a first solar cell substrate arranged adjacent the first battery and including a first embedded battery heater; and a first solar cell mounted directly to the first solar cell substrate and connected to the first battery.

In another embodiment, the modular solar cell array can further include a second solar cell module including: a second module substrate including a second high-emissivity side and a second mounting side; a second power management circuit mounted to the second mounting side of the second module substrate; a second battery arranged adjacent to the second power management circuit; a second solar cell substrate arranged adjacent the second battery and including a second embedded battery heater; and a second solar cell mounted directly to the second solar cell substrate and connected to the second battery.

In another embodiment of the modular solar cell array, the first solar cell module and the second solar cell module are independently connected to a space vehicle flight controller.

In another embodiment of the modular solar cell array, the first module substrate and the second module substrate include and/or define a unitary structure.

In another embodiment of the modular solar cell array, the first module substrate and the second module substrate include and/or define independently connectable structures.

In another embodiment of the modular solar cell array, the first power management circuit includes a first battery charge control module, a first solar cell monitoring module, and a first solar cell management module; and the second power management circuit includes a second battery charge control module, a second solar cell monitoring module, and a second solar cell management module.

In another embodiment of the modular solar cell array, the first power management circuit further includes a first communications module configured to communicate with the space vehicle flight controller; and the second power management circuit further includes a second communications module configured to communicate with the space vehicle flight controller.

In another embodiment, a modular solar cell system includes a solar cell module including: a module substrate including a high-emissivity side and a mounting side; a power management circuit mounted to the mounting side of the module substrate and including a communications module; a battery arranged adjacent to the power management circuit; a solar cell substrate arranged adjacent the battery and including an embedded battery heater; and a solar cell mounted directly to the solar cell substrate and connected to the battery.

In another embodiment, the modular solar cell system can also include a space vehicle flight controller arranged in a space vehicle and configured to communicate with the communications module of the power management circuit; and manage a voltage output of the solar cell module in response to one of a power demand of the space vehicle or a power level of the battery.

In yet another embodiment, the modular solar cell system can also include a second solar cell module including: a second module substrate including a second high-emissivity side and a second mounting side; a second power management circuit mounted to the second mounting side of the second module substrate and including a second communications module; a second battery arranged adjacent to the second power management circuit; a second solar cell substrate arranged adjacent the second battery and including a second embedded battery heater; and a second solar cell mounted directly to the second solar cell substrate and connected to the second battery.

In yet another embodiment of the modular solar cell system, the space vehicle flight controller is further configured to communicate with the second communications module of the second power management circuit; and manage a second voltage output of the second solar cell module in response to one of the power demand of the space vehicle or a second power level of the second battery.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Generally, embodiments of the present invention include a modular and scalable power system solution for any size of satellite or satellite constellation. Embodiments of the systems and modules described herein can be arranged singularly in a completed and testable manner, such that the space qualification of a single module can suffice for all subsequent modules used in the same satellite system or constellation. Accordingly, testing and approval of a single module can provide satellite designers and operators with the confidence to design, manufacture, and deploy modular space power systems at scale for all size and configuration of satellite system or constellation. Embodiments of the systems and modules described herein provide significant technical benefits, including lower operating temperatures and battery heating as well as significant reduction in size and weight of the power management package. Moreover, embodiments of the systems and modules described herein also provide significant logistical and supply chain benefits in the design and manufacture of satellite systems and constellations as the power systems described herein can be designed, tested, and deployed at scale in a modular fashion.

1. Solar Cell Module

Figure 1:
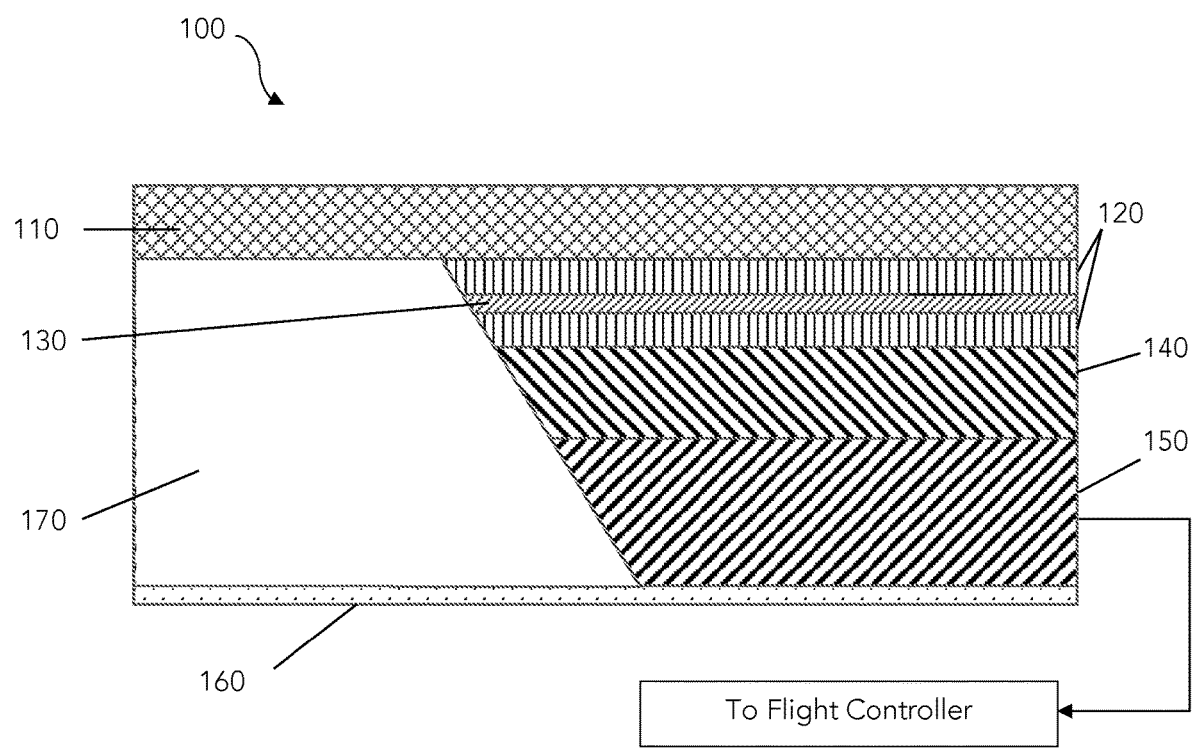
FIG. 1 is cross-sectional schematic diagram of a solar cell module in accordance with an example embodiment of the present invention.

As shown in FIG. 1, one embodiment of a solar cell module 100 can include a module substrate 170 including and/or defining a high-emissivity side 160 and a mounting side. The module substrate 170 can function to enclose and/or support additional aspects, features, or components of the solar cell module 100 and also to transfer, sink, absorb, and/or emit thermal energy or heat from the additional aspects, features, or components of the solar cell 100 to an adjacent surface or space.

As shown in FIG. 1, the high emissivity side 160 of the module substrate 170 can include and/or define a material manufactured and/or configured to receive, transfer, and/or emit thermal energy from the solar cell module 100 to a space or surface adjacent to the high emissivity side 160, including for example a space vehicle chassis. Generally, the mounting side of the module substrate 170 can include and/or define an opposing side of the high emissivity side 160 of the module substrate 170.

In one variation of the module substrate 170, the mounting side and the high emissivity side 160 are substantially the same material, such as aluminum, magnesium, vanadium, titanium, steel, carbon composite, and/or combinations, mixtures, or alloys thereof. In another variation of the module substrate 170, the high emissivity side 160 of includes a distinct material, coating, or doping that increases its emissivity relative to the mounting side of the module substrate 170.

In one example implementation, the body of the module substrate 170 can include a first material, such as a material, mixture, or alloy listed above, and the high emissivity side 160 can include a coating, deposit, or dopant that increases the emissivity of at least a portion of the module substrate 170. In another example implementation, the module substrate 170 can manufactured by advanced manufacturing or three-dimensional printing techniques in which the material is characterized by increasing, blended, or changing emissivity throughout such that a portion of the module substrate 170 nearest the high emissivity side 160 defines a higher thermal emissivity than other portions of the module substrate 170.

In another variation of the embodiments, the module substrate 170 can enclose the power management circuit 15o, the battery 14o, and the solar cell substrate 120. For example, as shown in FIG. 1, the module substrate 170 can define a housing or container of a depth in which the power management circuit 150, the battery 14o, and the solar cell substrate 120 can be substantially packaged and enclosed while also exposing at least one surface of the solar cell no to incoming light.

As shown in FIG. 1, the solar cell module 100 can also include a power management circuit 150 mounted to the mounting side of the module substrate 170. Generally, the power management circuit 150 can function to monitor, measure, record, transmit, and/or control a power output (via measured current and/or voltage) from a solar cell and/or charge control of a battery, as described in detail below. In one embodiment, the power management circuit 150 can include a printed circuit board (PCB) on a PCB substrate such as a polymer or polyamide film.

In another variation of the solar cell module 100, the power management circuit 150 can be connected to and/or in communication with a flight controller or flight control system of a space vehicle. For example, the power management circuit 150 can include a communications module that is configured to communicate with a space vehicle flight controller as described in greater detail below.

In another variation of the embodiments, the power management circuit 150 can include one or more of a battery charge control module, a solar cell monitoring module, and a solar cell management module. Generally, the battery control module can be configured to manage a voltage, temperature, current draw, charge cycle, discharge cycle, and/or other parameters associated with performance of the battery 140. Generally, the solar cell monitoring module can be configured to measure and monitor a voltage and/or current output of the solar cell no during operation to determine and/or control performance of the solar cell no. Generally, the solar cell management module can be configured to manage, direct, and control an output of the solar cell no to one or more of the battery 140 or the electrical loads associated with the space vehicle.

As shown in FIG. 1, the solar cell module 100 can also include a battery 140 arranged adjacent to the power management circuit 150. Generally, the battery 140 can function to receive, store, and release electrical energy to energy consuming components of a space vehicle. In one variation of the solar cell module 100, the battery 140 can include a chemical battery, for example such as a solid state lithium ion battery. Alternatively, the battery 140 can include a set of lithium ion cells arranged in a lithium ion battery. Generally, in operation the battery 140 can maintain a desired voltage and/or current flow, which can be measured, monitored, and controlled by the power management circuit 150 described herein.

As shown in FIG. 1, the solar cell module 100 can further include a solar cell substrate 120 arranged adjacent the battery 140 and including an embedded battery heater 130. Generally, the solar cell substrate 120 can function to support the solar cell no (described herein) adjacent the battery 140 and further to supply heat to the battery 140 via the embedded battery heater 130. In one variation of the solar cell module 100, the solar cell substrate 120 can include or be manufactured of aluminum or aluminum alloy surrounding or embedding the embedded heater 130. In another variation of the solar cell module 100, the embedded heater 130 can function to dissipate or direct heat at the battery 140 such that a temperature of the battery 140 remains within a predefined range during operations (e.g., while on orbit). Therefore, the solar cell substrate 120 and embedded heater 130 can function to maintain a substantially narrow temperature operating range for the battery 140, even when the solar cell module 100 is deployed in operational environments that experience extreme temperature shifts.

As shown in FIG. 1, the solar cell module 100 can also include a solar cell 110 mounted directly to the solar cell substrate 120 and connected to the battery 140. Generally, the solar cell 110 can function to receive incident photons and convert the received photons into electrical energy, which in turn can be directed to one or both of the battery 140 and/or electrical loads directly or indirectly connected to the solar cell 110. In one variation of the solar cell module 100, the solar cell 110 is indirectly mounted to the solar cell substrate 120, such as via a secondary substrate, heater, or support structure.

In another variation of the solar cell module 100, the solar cell 110 can include an inverted metamorphic solar cell, which can operate at greater than thirty percent efficiency at negative thirty degrees Celsius with high reflectivity in the infrared band. In yet another variation of the solar cell module 100, the solar cell 110 can include an inverted metamorphic solar cell and the solar cell substrate 120 can include a thermally conductive material, which in turn permit can permit the solar cell 110 to operate at cooler temperatures and may result in increases in power efficiencies (e.g., approximately 5 to 10 percent increase in efficiency).

2. Array

Figure 2:
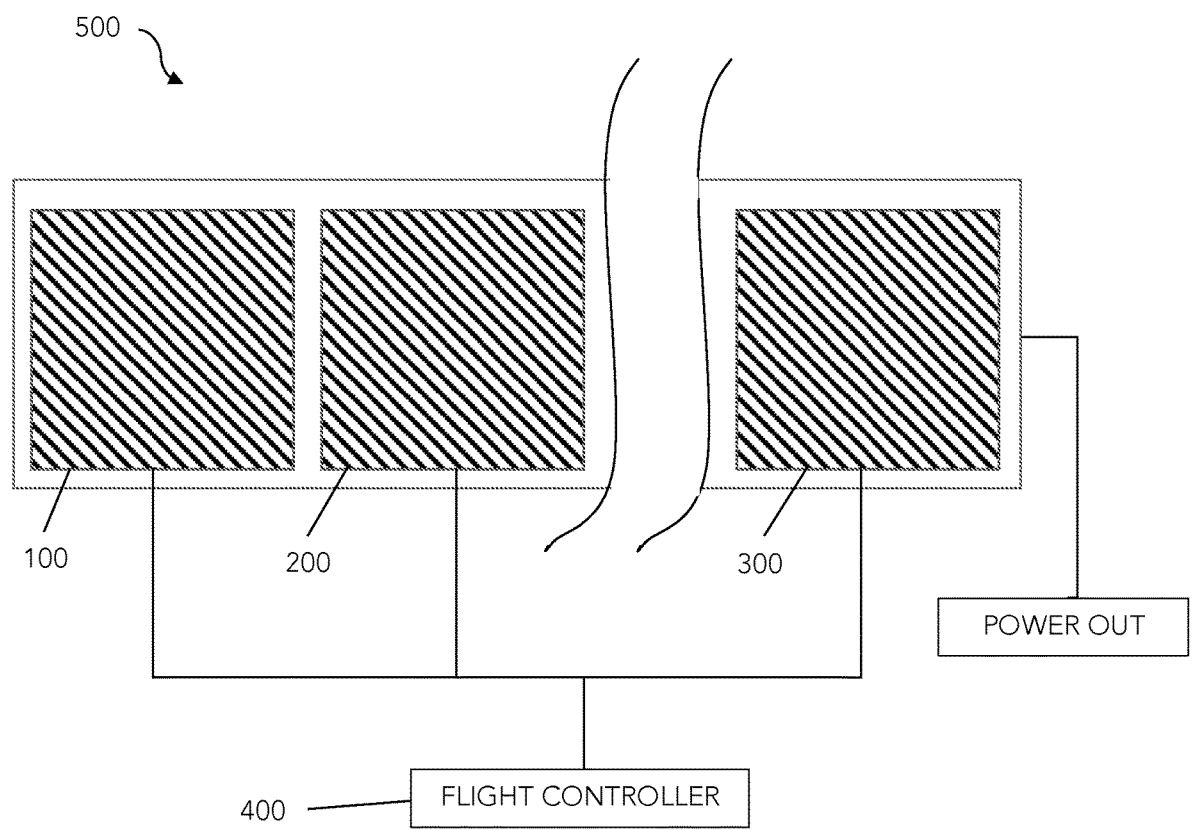
FIG. 2 is a schematic block diagram of a modular solar cell array in accordance with another example embodiment of the present invention.

As shown in FIGS. 1 and 2, another embodiment can include a modular solar cell array 500 that includes a set of solar cell modules of the type described above arranged cooperatively into a single array. For example, the modular solar cell array 500 can include: at least a first solar cell module 100 and a second solar cell module 200, each including and/or defining: a module substrate 170 including a high-emissivity side 160 and a mounting side; a power management circuit 150 mounted to the mounting side of the module substrate 160; a battery 140 arranged adjacent to the power management circuit 150; a solar cell substrate 120 arranged adjacent the battery 140 and comprising an embedded battery heater 130; and a solar cell 110 mounted directly to the solar cell substrate 120 and connected to the battery 140.

As shown in FIG. 2, each of the first solar cell module 100 and the second solar cell module 200 can be independently connected to and/or controlled by a space vehicle flight controller 400 via the power management circuit 150. In other variations of the embodiment, the modular solar cell array 500 can include a third, fourth, Nth solar cell module 300 that can also be independently connected to and/or controlled by the space vehicle flight controller 400.

In one variation of the embodiments, the module substrate 170 for a set of N solar cell modules (100, 200, 300, etc.) can be a unitary structure, for example a single housing or enclosure in which the set of N solar modules (100, 200, 300, etc.) can be arranged as shown in FIG. 1. Additionally, a unitary module substrate 170 can include an integrated control and communication interface that independently connects each power management circuit 150 of each solar cell module 100, 200, 300 to the space vehicle flight controller 400 for independent monitoring, management, and control of each solar cell module 100, 200, 300 within the modular solar cell array 500.

Alternatively, the module substrate 170 for the set of N cell modules (100, 200, 300, etc.) can be configured as discrete, independently connectable structures such that each module 100, 200, 300 can be added or removed from a larger modular solar cell array 500 through connection or disconnection of the module 100, 200, 300 to the modular solar cell array 500, for example through one or more of mechanical, electromagnetic, or magnetic couplings.

In another variation of the embodiments of the modular solar cell array 500, the module substrate 170 (either unitary or discrete structure(s)) can be manufactured from or composed of a material such as aluminum, magnesium, vanadium, titanium, steel, carbon composite, and/or combinations, mixtures, or alloys thereof. In another variation of the module substrate 170 (either unitary or discrete structure(s)), the high emissivity side 160 can include a distinct material, coating, or doping that increases its emissivity relative to the mounting side of the module substrate 170.

3. Modular Solar Cell Control System

Figure 3:
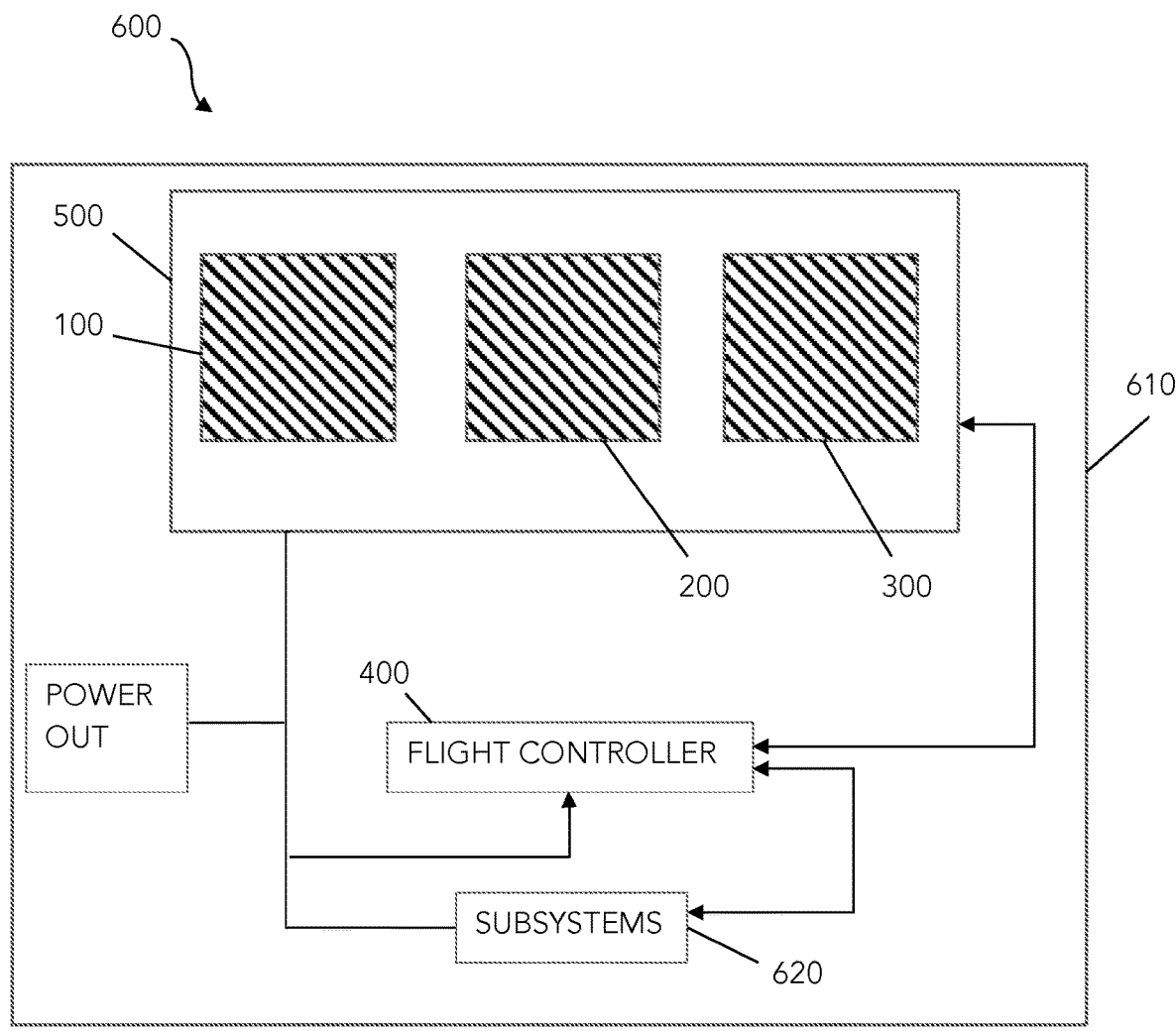
FIG. 3 is a schematic block diagram of a modular solar cell system in accordance with another example embodiment of the present invention.
Figure 4:
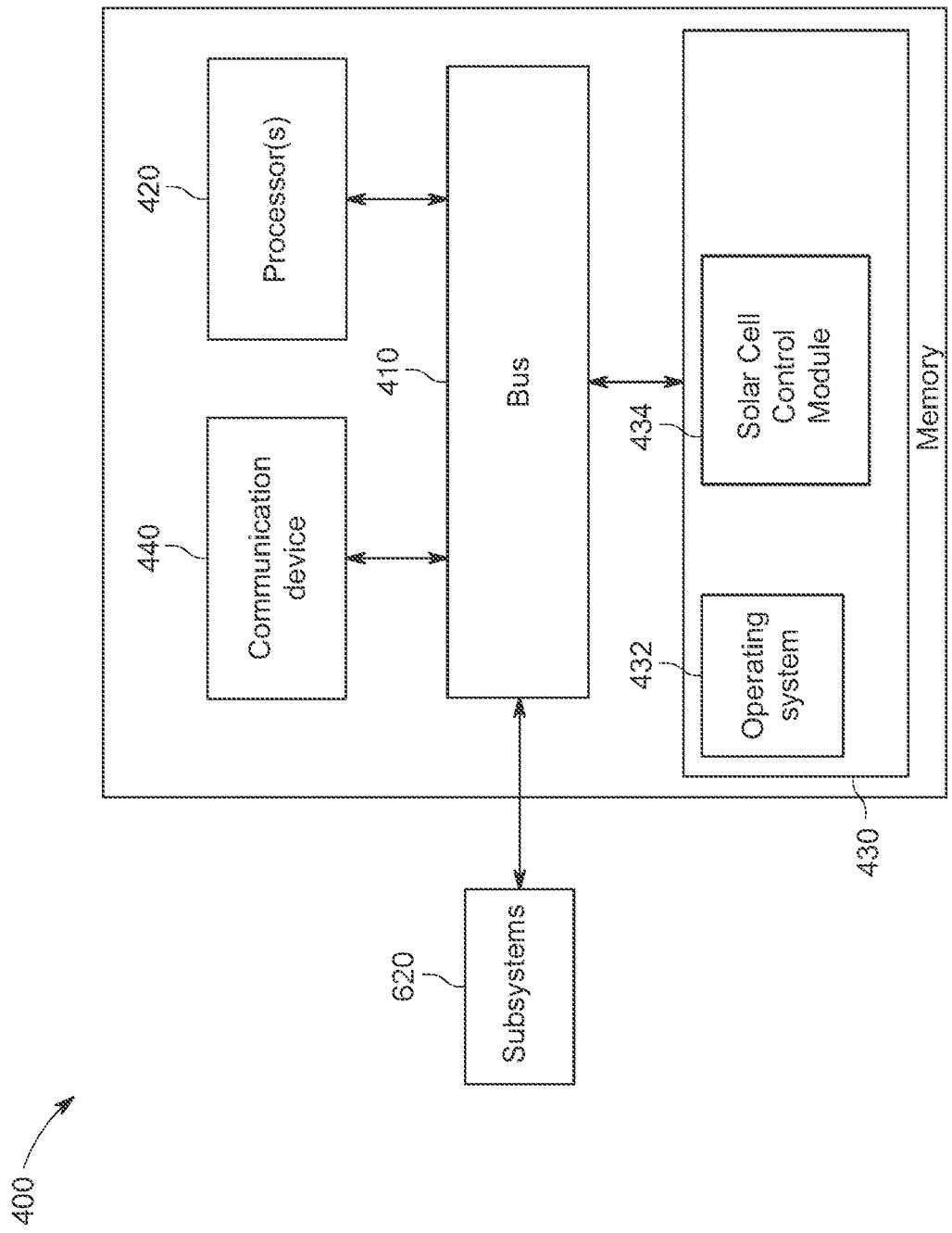
FIG. 4 is a schematic block diagram of a space vehicle flight controller for a modular solar cell system in accordance with another example embodiment of the present invention.

As shown in FIGS. 3 and 4, an embodiment of a modular solar cell control system boo can include a solar cell module 100, 200, 300 (or a set of solar cell modules 100, 200, 300) arranged in an array adjacent to, coupled with, or arranged with a space vehicle 610, for example arranged on or adjacent to a space vehicle chassis. As shown in FIG. 1, each of the solar cell modules 100, 200, 300 can include: a module substrate 170 including a high-emissivity side 160 and a mounting side; a power management circuit 150 mounted to the mounting side of the module substrate 160; a battery 140 arranged adjacent to the power management circuit 150; a solar cell substrate 120 arranged adjacent the battery 140 and comprising an embedded battery heater 130; and a solar cell 110 mounted directly to the solar cell substrate 120 and connected to the battery 140.

As shown in FIG. 3, the modular solar cell control system 600 and also include a space vehicle flight controller 400 arranged in a space vehicle 610 and configured to: communicate with the communications module of the power management circuit 150; and manage a voltage output of the solar cell module 100, 200, 300 in response to one of a power demand of the space vehicle 610 or a power level of the battery 140. For example, the space vehicle 610 can also include a set of subsystems 620 also in communication with and/or controlled by the space vehicle flight controller 400. The set of subsystems 620 can include: an attitude control and determination subsystem; a communications subsystem; a thermal management subsystem; a propulsion subsystem; and/or one or more payloads that require power from the modular solar cell system 600.

FIG. 4 is an exemplary architectural diagram illustrating a space vehicle flight controller 400 configured to automatically monitor, measure, and control at least a set of solar cell modules 100, 200, 300 and/or one or more space vehicle subsystems 620 of the type described above. In particular, as noted above, the space vehicle flight controller 400 can be configured to, for each solar cell module 100, 200, 300 in a set of solar cell modules 100, 200, 300: communicate with the communications module of the power management circuit 150; and manage a voltage output of the solar cell module 100, 200, 300 in response to one of a power demand of the space vehicle 610 or a power level of the battery 140 to thereby control a total bus voltage for the space vehicle.

In some embodiments, the space vehicle flight controller 400 can be one or more of the computing systems depicted and/or described herein. The space vehicle flight controller 400 can include a bus 410 or other communication mechanism for communicating information, and one or more processor(s) 420 coupled to the bus 410 for processing information. The processor(s) 420 can be any type of general or specific purpose processor, including a Central Processing Unit (CPU), an Application Specific Integrated Circuit (ASIC), a Field Programmable Gate Array (FPGA), a Graphics Processing Unit (GPU), multiple instances thereof, and/or any combination thereof. The processor(s) 420 can also have multiple processing cores, and at least some of the cores can be configured to perform specific functions. Multi-parallel processing can be used in some embodiments. In certain embodiments, at least one of the processor(s) 420 can be a neuromorphic circuit that includes processing elements that mimic biological neurons. In some embodiments, neuromorphic circuits might not require the typical components of a Von Neumann computing architecture.

The space vehicle flight controller 400 can also include a memory 430 for storing information and instructions to be executed by the processor(s) 420. The memory 430 can be comprised of any combination of Random Access Memory (RAM), Read Only Memory (ROM), flash memory, cache, static storage such as a magnetic or optical disk, or any other types of non-transitory computer-readable media or combinations thereof. Non-transitory computer-readable media can be any available media that can be accessed by the processor(s) 420 and can include volatile media, non-volatile media, or both. The media can also be removable, non-removable, or both.

Additionally, the space vehicle flight controller 400 can include a communication device 440, such as a transceiver, to provide access to a communications network via a wireless and/or wired connection. In some embodiments, the communication device 440 can be configured to use Frequency Division Multiple Access (FDMA), Single Carrier FDMA (SC-FDMA), Time Division Multiple Access (TDMA), Code Division Multiple Access (CDMA), Orthogonal Frequency Division Multiplexing (OFDM), Orthogonal Frequency Division Multiple Access (OFDMA), Global System for Mobile (GSM) communications, General Packet Radio Service (GPRS), Universal Mobile Telecommunications System (UMTS), cdma2000, Wideband CDMA (W-CDMA), High-Speed Downlink Packet Access (HSDPA), High-Speed Uplink Packet Access (HSUPA), High-Speed Packet Access (HSPA), Long Term Evolution (LTE), LTE Advanced (LTE-A), 802.11x, Wi-Fi, Zigbee, Ultra-WideBand (UWB), 802.16x, 802.15, Home Node-B (HnB), Bluetooth, Radio Frequency Identification (RFID), Infrared Data Association (IrDA), Near-Field Communications (NFC), fifth generation (5G), New Radio (NR), any combination thereof, and/or any other currently existing or future-implemented communications standard and/or protocol without deviating from the scope of the claimed invention. In some embodiments, the communication device 440 can include one or more antennas that are singular, arrayed, phased, switched, beamforming, beamsteering, a combination thereof, and or any other antenna configuration without deviating from the scope of the claimed invention.

The processor(s) 420 are further coupled via the bus 410 to one or more space vehicle subsystems 620 of the type described above. For example the processor(s) 420 can be configured to execute instructions relating to the operation, measurement, or maintenance of one or more of the following space vehicle subsystems 620: an attitude control and determination subsystem; a communications subsystem; a thermal management subsystem; a propulsion subsystem; and/or one or more payloads The memory 430 stores software modules that provide functionality when executed by the processor(s) 420. The modules can include an operating system 432 for computer system 100. The modules can further include a solar cell control module 434 that is configured to perform all or part of the processes, techniques, or methods described herein or derivatives thereof, including but not limited to the monitoring, maintenance, control, and provision of power between the set of solar cell modules 100, 200, 300 and the space vehicle subsystems 620. The space vehicle flight controller 400 can include one or more additional modules that include additional functionality.

One skilled in the art will appreciate that a "flight controller" could be embodied as a binary computing device, a quantum computing device, or any other suitable computing device, or combination of devices without deviating from the scope of the claimed invention. Presenting the above-described functions as being performed by a "flight controller" is not intended to limit the scope of the claimed invention in any way, but is intended to provide one example of the many embodiments of the claimed invention. Indeed, methods, systems, and apparatuses disclosed herein can be implemented in localized and distributed forms consistent with computing technology, including cloud computing systems and paired computing systems (e.g., terrestrial and on-orbit flight controllers).

It should be noted that some of the power management circuit 150 and space vehicle flight controller 400 features described in this specification have been presented as modules, in order to emphasize their implementation independence more particularly. As noted above, the power management circuit 150 can include exemplary modules such as: a battery charge control module, a solar cell monitoring module, a solar cell management module, and/or a communications module that can be configured to communicate with the space vehicle flight controller 400. The space vehicle flight controller 400 can include at least a solar cell control module 434 as well as other functional modules for command and/or control of the various space vehicle subsystems 620.

Generally, a module can be implemented as a hardware circuit comprising custom very large scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices, graphics processing units, or the like.

A module can also be at least partially implemented in software for execution by various types of processors. An identified unit of executable code can, for instance, include one or more physical or logical blocks of computer instructions that can, for instance, be organized as an object, procedure, or function. Nevertheless, the executables of an identified module need not be physically located together, but can include disparate instructions stored in different locations that, when joined logically together, comprise the module and achieve the stated purpose for the module. Further, modules can be stored on a computer-readable medium, which can be, for instance, a hard disk drive, flash device, RAM, tape, and/or any other such non-transitory computer-readable medium used to store data without deviating from the scope of the invention.

Indeed, a module of executable code could be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network.

The various modules can execute one or more methods performed by a computer program, encoding instructions for the processor(s) to perform at least part of the process(es), techniques, or methods described herein, in accordance with embodiments of the claimed invention. The computer program can be embodied on a non-transitory computer-readable medium. The computer-readable medium can be, but is not limited to, a hard disk drive, a flash device, RAM, a tape, and/or any other such medium or combination of media used to store data. The computer program can include encoded instructions for controlling the processor(s) of a computer system (e.g., the power management circuit 150 or the space vehicle flight controller 400) to implement all or part of the process steps described in herein, which can also be stored on the computer-readable medium.

The computer program can be implemented in hardware, software, or a hybrid implementation. The computer program can be composed of modules that are in operative communication with one another, and which are designed to pass information or instructions to other components of the space vehicle. The computer program can be configured to operate on a general purpose computer, an ASIC, or any other suitable device.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

What is claimed is:

1. A solar cell module comprising:
   a module substrate partially connected to a solar cell on a first side and partially connected to high-emissivity material on a second side, the second side being a high-emissivity side, wherein
   the module substrate comprising a mounting side on a plane perpendicular to the first side and the second side, and is configured to transfer heat from the solar cell to an adjacent surface or space by way of the high-emissivity material;
   a power management circuit mounted to the mounting side of the module substrate;
   a battery arranged adjacent to the power management circuit;
   a solar cell substrate arranged adjacent the battery and comprising an embedded battery heater; and
   a surface of the solar cell mounted directly to the solar cell substrate and connected to the battery, wherein
   the power management circuit, the battery, and the solar cell substrate are mounted to the mounting side of the module substrate and are between the high-emissivity material and the surface of the solar cell.

2. The solar cell module of claim 1, wherein the module substrate comprises aluminum.

3. The solar cell module of claim 2, wherein the module substrate encloses the power management circuit, the battery, and the solar cell substrate.

4. The solar cell module of claim 1, wherein the battery comprises a lithium ion solid state battery.

5. The solar cell module of claim 1, wherein the solar cell comprises an inverted metamorphic solar cell.

6. The solar cell module of claim 1, wherein the power management circuit comprises a power management circuit substrate comprising a polyamide film.

7. The solar cell module of claim 6, wherein the power management circuit comprises a battery charge control module, a solar cell monitoring module, and a solar cell management module.

8. The solar cell module of claim 7, wherein the power management circuit further comprises a communications module, and wherein the communications module is configured to communicate with a space vehicle flight controller.

9. The solar cell module of claim 1, wherein the high emissivity side of the module substrate is arranged adjacent a space vehicle chassis.

10. A modular solar cell array comprising:
    a first solar cell module comprising:
       a first module substrate partially connected to a solar cell on a first side and partially connected to high-emissivity material on a second side, the second side being a high-emissivity side, wherein
       the first module substrate comprising a mounting side on a plane perpendicular to the first side and the second side;
       a first power management circuit mounted to the first mounting side of the first module substrate;
       a first battery arranged adjacent to the first power management circuit;
       a first solar cell substrate arranged adjacent the first battery and comprising a first embedded battery heater; and
       a surface of the first solar cell mounted directly to the first solar cell substrate and connected to the first battery, wherein
       the first power management circuit, the first battery, and the first solar cell substrate are mounted to the mounting side of the first module substrate and are between the high-emissivity material and the surface of the first solar cell;
    a second solar cell module comprising:
       a second module substrate partially connected to a solar cell on a first side and partially connected to high-emissivity material on a second side, the second side being a high-emissivity side, wherein
       the second module substrate comprising a mounting side on a plane perpendicular to the first side and the second side, and is configured to transfer heat from the solar cell to an adjacent surface or space by way of the high-emissivity material;
       a second power management circuit mounted to the second mounting side of the second module substrate;
       a second battery arranged adjacent to the second power management circuit;
       a second solar cell substrate arranged adjacent the second battery and comprising a second embedded battery heater; and
       a surface of the second solar cell mounted directly to the second solar cell substrate and connected to the second battery, wherein
       the second power management circuit, the second battery, and the second solar cell substrate are mounted to the mounting side of the second module substrate and are between the high-emissivity material and the surface of the second solar cell;
    wherein the first solar cell module and the second solar cell module are independently connected to a space vehicle flight controller.

11. The modular solar cell array of claim 10, wherein both the first module substrate and the second module substrate are separate and unitary structures.

12. The modular solar cell array of claim 10, wherein the first module substrate and the second module substrate comprise independently connectable structures.

13. The modular solar cell array of claim 10, wherein the first module substrate comprises aluminum and the second module substrate comprises aluminum.

14. The modular solar cell array of claim 13, wherein:
    the first module substrate encloses the first power management circuit, the first battery, and the first solar cell substrate; and
    the second module substrate encloses the second power management circuit, the second battery, and the second solar cell substrate.

15. The modular solar cell array of claim 10, wherein:
    the first power management circuit comprises a first battery charge control module, a first solar cell monitoring module, and a first solar cell management module; and
    the second power management circuit comprises a second battery charge control module, a second solar cell monitoring module, and a second solar cell management module.

16. The modular solar cell array of claim 15, wherein:
    the first power management circuit further comprises a first communications module, and wherein the first communications module is configured to communicate with the space vehicle flight controller; and the second power management circuit further comprises a second communications module, and wherein the second communications module is configured to communicate with the space vehicle flight controller.

17. The modular solar cell array of claim 10, wherein:
the first battery comprises a lithium ion solid state battery; and
the second battery comprises a lithium ion solid state battery.

18. The modular solar cell array of claim 10, wherein:
the first solar cell comprises an inverted metamorphic solar cell; and
the second solar cell comprises an inverted metamorphic solar cell.

19. A modular solar cell system comprising:
a solar cell module comprising:
   a module substrate partially connected to a solar cell on a first side and partially connected to high-emissivity material on a second side, the second side being a high-emissivity side, wherein
   the module substrate comprising a mounting side on a plane perpendicular to the first side and the second side, and is configured to transfer heat from the solar cell to an adjacent surface or space by way of the high-emissivity material;
   a power management circuit mounted to the mounting side of the module substrate and comprising a communications module;
   a battery arranged adjacent to the power management circuit;
   a solar cell substrate arranged adjacent the battery and comprising an embedded battery heater; and
   a surface of the solar cell mounted directly to the solar cell substrate and connected to the battery, wherein
   the power management circuit, the battery, and the solar cell substrate are mounted to the mounting side of the module substrate and are between the high-emissivity material and the surface of the solar cell;
a space vehicle flight controller arranged in a space vehicle and configured to:
   communicate with the communications module of the power management circuit; and
   manage a voltage output of the solar cell module in response to one of a power demand of the space vehicle or a power level of the battery.

20. The modular solar cell system of claim 19, further comprising:
a second solar cell module comprising:
   a second module substrate comprising a second high-emissivity side and a second mounting side;
   a second power management circuit mounted to the second mounting side of the second module substrate and comprising a second communications module;
   a second battery arranged adjacent to the second power management circuit;
   a second solar cell substrate arranged adjacent the second battery and comprising a second embedded battery heater; and
   a second solar cell mounted directly to the second solar cell substrate and connected to the second battery; and
wherein the space vehicle flight controller is further configured to:
   communicate with the second communications module of the second power management circuit;
   manage a second voltage output of the second solar cell module in response to one of the power demand of the space vehicle or a second power level of the second battery; and
   control a total bus voltage of the space vehicle based on management of the first voltage output and the second voltage output.

* * * * *